United States Patent
Lassen

(10) Patent No.: US 10,439,626 B2
(45) Date of Patent: Oct. 8, 2019

(54) ANALOG-TO-DIGITAL CONVERTER WITH AUTONOMOUS GAIN STAGE AND AUTO SCALING, AND RELATED SYSTEMS AND METHODS

(71) Applicant: Microchip Technology Incorporated, Chandler, AZ (US)

(72) Inventor: Jacob Lunn Lassen, Saupstad (NO)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 16/144,700

(22) Filed: Sep. 27, 2018

(65) Prior Publication Data

US 2019/0190528 A1 Jun. 20, 2019

Related U.S. Application Data

(63) Continuation-in-part of application No. 15/901,420, filed on Feb. 21, 2018.

(60) Provisional application No. 62/599,460, filed on Dec. 15, 2017.

(51) Int. Cl.
*H03M 1/06* (2006.01)
*G01R 31/382* (2019.01)
*G01R 31/36* (2019.01)
*H03G 3/30* (2006.01)

(52) U.S. Cl.
CPC ...... *H03M 1/0604* (2013.01); *G01R 31/3648* (2013.01); *G01R 31/382* (2019.01); *H03G 3/30* (2013.01)

(58) Field of Classification Search
CPC ........ H03M 1/18; H03M 1/183; H03M 1/185; H03M 1/1014; H03M 1/0604; H03G 3/20; H03G 3/30; G01R 31/382; G01R 31/3648

USPC .................................. 341/139, 155, 118, 120
See application file for complete search history.

(56) References Cited

U.S. PATENT DOCUMENTS

| 7,268,714 | B2* | 9/2007 | Sherry | H03M 1/187 |
|---|---|---|---|---|
| | | | | 341/139 |
| 7,327,294 | B2 | 2/2008 | Gierenz et al. | |
| 7,405,683 | B1* | 7/2008 | Perrin | H03M 1/185 |
| | | | | 341/139 |
| 7,965,208 | B2 | 6/2011 | McLoughlin | |
| 9,256,399 | B2 | 2/2016 | Hanssen | |

(Continued)

FOREIGN PATENT DOCUMENTS

EP 1312168 A1 5/2003

OTHER PUBLICATIONS

ISA/206—Invitation to Pay Additional Fees Mailed on Mar 29, 2019 for WO Application No. PCT/US18/064552.

(Continued)

*Primary Examiner* — Khai M Nguyen
(74) *Attorney, Agent, or Firm* — TraskBritt

(57) ABSTRACT

Disclosed systems, methods and devices relate, generally, to autonomous signal processing and autonomous signal processing units of a microcontroller. The autonomous data processing units may be configured to perform one or more functions independently, without input from a processing unit of the microcontroller, and may, monitor and/or perform operations that are part of one or more control loops that operate independent of the microcontroller processor. The control loops may or may not be in support of control loops monitored by the processor of the microcontroller.

56 Claims, 12 Drawing Sheets

(56) References Cited

U.S. PATENT DOCUMENTS

| | | |
|---|---|---|
| 9,473,161 B1 | 10/2016 | Kern |
| 9,762,255 B1 | 9/2017 | Satoskar et al. |
| 2007/0296478 A1 | 12/2007 | Alfano et al. |
| 2014/0107486 A1 | 4/2014 | Kaplan et al. |

OTHER PUBLICATIONS

International Written Opinion for International Application No. PCT/US18/64552, dated May 22, 2019, 14 pages.
International Search Report for International Application No. PCT/US18/64552, dated May 22, 2019, 8 pages.

\* cited by examiner (State of the Art)

ANALOG-TO-DIGITAL CONVERTER WITH AUTONOMOUS GAIN STAGE AND AUTO SCALING, AND RELATED SYSTEMS AND METHODS

CROSS-REFERENCE TO RELATED APPLICATION

This application is a continuation-in-part under 35 U.S.C. § 120 of U.S. patent application Ser. No. 15/901,420, filed Feb. 21, 2018, which claims the benefit under 35 U.S.C. § 119(e) of U.S. Provisional Patent Application Ser. No. 62/599,460, filed Dec. 15, 2017, the entire contents and disclosure of each of which is hereby incorporated herein by this reference.

TECHNICAL FIELD

The embodiments of the present disclosure generally relate to signal processing, and more specifically, to analog-to-digital converters (ADC), including ADCs that are used in applications that have a need for large dynamic signal range.

BACKGROUND

Many embedded digital applications read analog inputs and so have to convert those inputs to digital results. An ADC accepts an analog input signal (typically a voltage or a current), samples it, and converts each sample to a digital value that can be read, e.g., by a microcontroller, a microprocessor, a digital circuit, etc. Generally, the measurable output of an ADC is the (Vin/Vref)×Resolution. Resolution is a characteristic of an ADC, and may be expressed as the quantum of the input analogue voltage change required to increment an ADC's digital output from one value to the next higher code value. For example, the resolution of an 8-bit ADC may be expressed as one part in 255 or as 0.4% of full scale or simply as 8-bit resolution. So, if such an ADC has a full-scale analogue input signal range of 10 V then it may resolve a 40 mV change in input signal. The step size is the voltage difference between one digital level (i.e., 0001) and the next one (i.e., 0010 or 0000). For example, if an ADC has a step size of 40 mV, an input of 40 mV will produce an output in an 8-bit converter of 0000 0001.

Thus, to measure and convert small signal changes accurately, conventional ADCs use a higher resolution (i.e., capability to resolve a small mV change in input) while still being able to measure and convert large signal changes accurately (i.e., capability to resolve a larger mV change in input). For a conventional ADC that is expected to measure a wide dynamic range the measurements are relatively coarse when measuring small analog signals, that is the relative step size between each digital code is large when measuring small analog signals, while relatively fine when measuring large analog signals, that is the relative step size between each digital code is relatively small.

Many embedded applications that read an analog input signal require a large dynamic range and accurate measurements, that is, the ability to measure from a low voltage (e.g., the ground voltage) up to a high voltage (e.g., up to the system supply voltage)—while doing so accurately. For this reason, many applications need increasing ADC resolution. Conventional embedded applications typically, therefore, use a high-resolution ADC, e.g., 12-bit, 14-bit or higher, or an internal, programmable, gain stage for the ADC, so that small signals can be amplified as shown in FIG. 1.

BRIEF DESCRIPTION OF THE DRAWINGS

The purpose and advantages of the embodiments of the disclosure will be apparent to one of ordinary skill in the art from the summary in conjunction with the detailed description and appended drawings.

DETAILED DESCRIPTION

Figure 1:
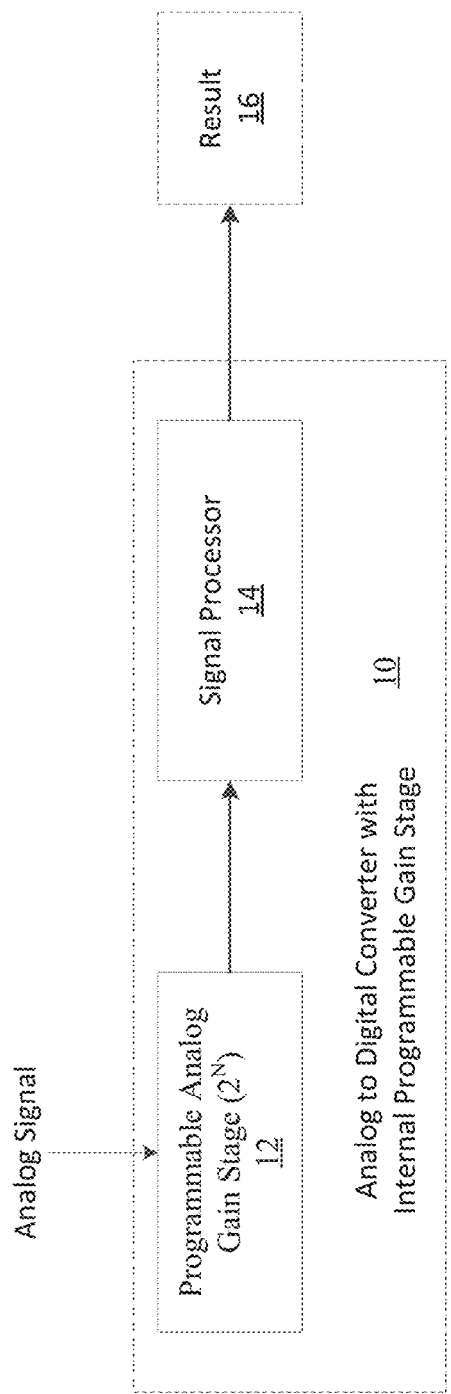
FIG. 1 shows an ADC with internal gain stage according to the state of the art.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary,"

"by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the terms "automated," "autonomous," or "auto" if used to describe a gain stage or scaling (e.g., "autonomous gain stage" or "auto scaling") means that adjustment of the gain stage or scaling occurs without the supervision of a host processor. Accordingly, an ADC that incorporates an "autonomous gain stage" or "auto scaling," may, by way of example, be a core independent peripheral.

As used herein, the term "gain" is used generically to refer to the amplification, or reduction, of an input signal to respectively create a larger, or smaller, output signal proportional to the input signal. Thus, in the case of a reduction, gain may be considered a "fractional gain" where the output signal may be smaller than the input signal. Moreover, in cases where the gain is one, the output signal may match the input signal.

High resolution ADCs are expensive (cost), so it is desirable to use gain adjustment on an input signal so that a lower resolution ADC may be used to convert it. One way to perform the gain adjustment is with software control (e.g., using a microcontroller's processor), however, it is now understood by the inventors of this disclosure that performing gain under software control may introduce delays and interfere with sampling at a normal desired frequency. Thus, performing gain adjustment in software may not be practical for applications that require a high sample rate. Correcting these drawbacks adds complexity and further tradeoffs in terms of delay and computing power. By way of example, tracking the gain for each sample in software so that it can be later scaled down adds significant memory requirements.

Moreover, automated features that facilitate independent task completion without supervision by a CPU or other host are restrained by the software. Any application that incorporated an ADC with a software controlled gain stage would not be able to operate as a core independent peripheral.

Various embodiments of the disclosure relate, generally, to a system that includes an ADC, autonomous gain adjustment of the analog input signal to the ADC, and auto scaling of the ADCs result. In one embodiment, a control circuit monitors the ADC and configures the gain adjustment on the analog input signal and an auto scaling of the result of the ADC. Such a system does not suffer the same delay and overhead drawbacks of conventional ADCs with internal gain stage or techniques that control the gain and scaling in software.

An ADC and circuitry for autonomous gain adjustment of the input signal to the ADC and auto scaling of the ADC result may also be characterized in this disclosure as an "autonomously adjustable ADC" or an "an autonomously adjustable ADC circuit."

Figure 2:
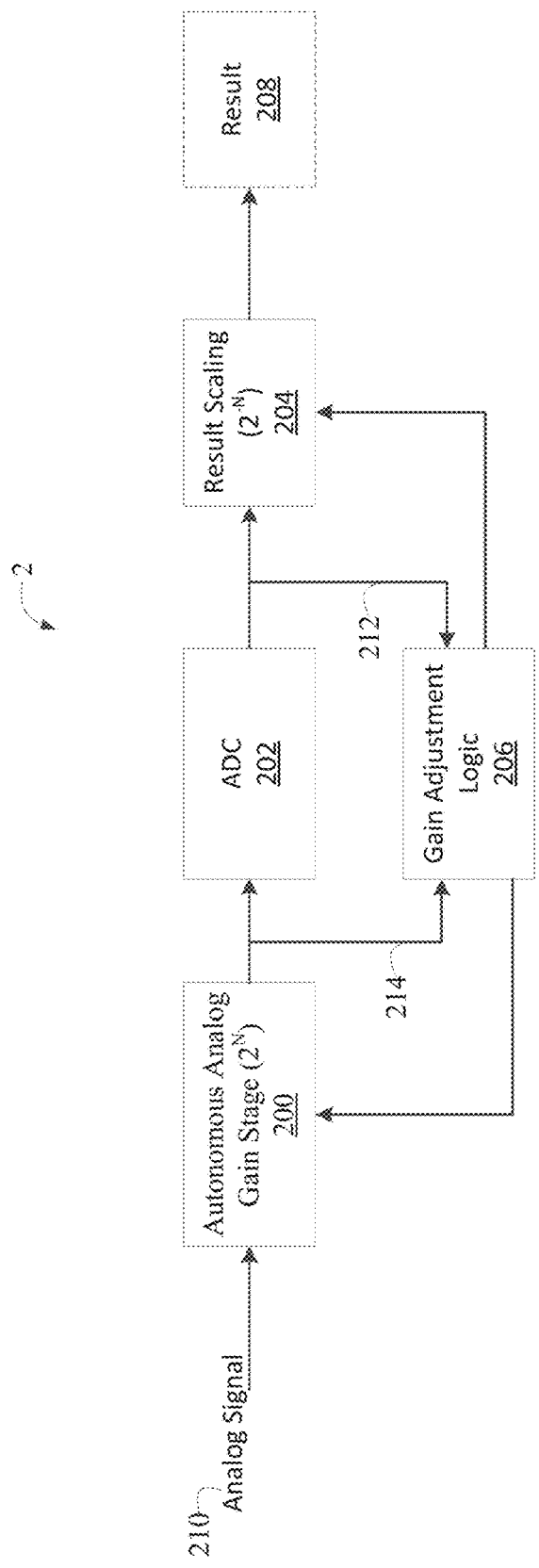
FIG. 2 shows functional blocks of an ADC with autonomous gain stage and gain adjustment, and auto scaling, in accordance with an embodiment of the disclosure.

FIG. 2 shows a functional block diagram of a system including an ADC 202 with an autonomous analog gain stage (AAGS) 200 and auto digital result scaling (ADRS) 204, in accordance with an embodiment of the disclosure.

The AAGS 200 may be configured to amplify (or reduce) an input analog signal 210 according to a gain, and the amplified analog signal may be provided to the ADC 202. The gain of the AAGS 200 may be configurable. In one embodiment, a gain may be selected from among a number of gain options, e.g., select N, where, $2^N=2^{-2}, 2^{-1}, 2^0, 2^1, 2^2, 2^3, 2^4, 2^5,$ or $2^6$ (N is limited only by the maximum gain available). In some embodiments, the gain options may be fractional in order to create a signal reduction, rather than a signal amplification.

The ADRS 204 may be configured to scale down (or up) a digital result, including a digital result received from the ADC 202. The ADRS 204 may scale the digital result based on a scaling component, for example, a scaling component associated with a gain applied to the analog signal at an AAGS 200. In one embodiment, the ADRS 204 may scale a digital result proportionally to the gain applied to the analog input signal. If no gain is applied then, of course, the result is not scaled down responsive to a gain. In one embodiment (and most applications) the digital result is scaled to the assumed function of the ADC 202 (e.g., as provided in the ADCs specification), though in some applications a different scaling factor may be used. In one embodiment, the scaling component may be selectable from among a number of scaling options, e.g., select –N where, $2^{-N}=2^2, 2^1, 2^0, 2^{-1}, 2^{-2}, 2^{-3}, 2^{-4}, 2^{-5},$ or $2^{-6}$ (N is limited only by the maximum scaling available). In one embodiment, the scaling component or an indicator indicative of the scaling components is provided to the ADRS 204.

The gain adjustment logic 206 may be configured to monitor a signal level 214 at the input of ADC 202, configure the amplification of the input analog signal 210, and configure the scaling of the digital result 212 output by the ADC 202. In various embodiments, gain adjustment logic 206 may be configured to monitor the signal level 214 of analog signal 210 by monitoring the input of AAGS 200 and/or the output of ADC 202.

In various embodiments, the gain adjustment logic 206 may be an analog or digital circuit. In analog embodiments the gain adjustment logic 206 may be, by way of non-limiting example, a threshold detection circuit. In digital embodiments the gain adjustment logic 206 may be, by way of non-limiting example, a configurable state machine coupled to a memory (e.g., flip-flop, register, etc.), an FPGA, or another type of digital circuit. The gain adjustment logic 206 may be configured to compare the signal levels 214 at the input of ADC 202 to a gain adjustment threshold. A gain adjustment threshold may be based on an ADC's dynamic range or a sub-range within an ADC's dynamic range. For example, the gain adjustment threshold may be defined as a sub-range within the dynamic range of an ADC selected to keep the analog input within a dynamic range of an ADC.

By way of non-limiting example, assume that the amplitude of the analog signal at the input of the ADC 202 increases from 50% of the ADC reference (i.e., in the middle of the dynamic range of the ADC 202) by 5% of the ADC reference per sample. At the 10th sample, the increase is 50%, which is added to the starting point which was 50% of the dynamic range of the ADC 202. So, at an $11^{th}$ sample (in the absence of some intervention) the ADC 202 would saturate as the input is 5% above the max limit that the ADC 202 can measure (i.e., outside the dynamic range of the ADC 202). However, because the gain adjustment logic 206 reduces the gain when the ADC 202 input reaches/passes a gain adjustment threshold then saturation may be avoided.

Continuing the non-limiting example, assume a gain adjustment threshold is set to 95% of the ADC reference, and the gain adjustment threshold is a threshold for an increasing analog signal 210. At the $9^{th}$ sample, the ADC 202 crosses the threshold (i.e., is sampling an input signal at 95% of its reference), and the gain adjustment logic 206 reduces the gain so that the analog signal is reduced by 50%, so (50%+45%)/2. After the signal is reduced, it is within the range defined by the gain adjustment threshold, which is 47.5% of the dynamic range. At 47.5% of the dynamic range the ADC 202 will not saturate if the input increases by 5%.

By way of another example, if the input of the ADC 202 increases in steps of 20% of the ADC reference per sample, then the ADC input reaches 90% after 2 samples and saturates on the $3^{rd}$ sample (110%). In one embodiment, the input change rate may be used to set a gain adjustment threshold, for example, if the input changes at a rate up to 20% of the dynamic range per sample, then the gain adjustment threshold may be set to 75% or lower (75%+20=95% or just below the saturation limit).

In embodiments where the gain adjustment logic 206 is a digital circuit, for example, a configurable state machine with memory—the gain adjustment logic 206 may configure the gain based on, at least in part, a digital result, or parts of a digital result. More particularly, gain adjustment logic 206 may be configured to digitally compare an input signal level to the gain adjustment threshold based on the digital result from the ADC 202. In another embodiment the gain adjustment logic 206 may be an analog circuit configured to compare the signal level of analog signal 210 to the gain adjustment threshold. So, depending on the implementation, the signal used by the gain adjustment logic 206 to determine the signal level at the input of AAGS 200 may be digital or analog, and the gain adjustment logic 206 may be either analog, digital, or a mix of analog and digital.

In one embodiment, the gain adjustment logic 206 may be configured to determine a gain by solving for the gain that would result in the monitored analog signal level being close to the reference level of the ADC 202 and to configure the AAGS 200 to use that determined gain. The gain adjustment logic 206 may be configured to provide a scaling component to the ADRS 204 based on a gain. In one embodiment, the scaling component may be based on a determined gain. In one embodiment, the gain adjustment logic 206 may be configured to solve for N in Equation 1:

$$\left(\frac{\text{Analog signal level} \times \text{Gain}}{ADC \text{ reference}} \times \text{Digital } ADC \text{ resolution}\right) \times \text{Result scaling} = \text{Digital result}$$

Figure 3A:
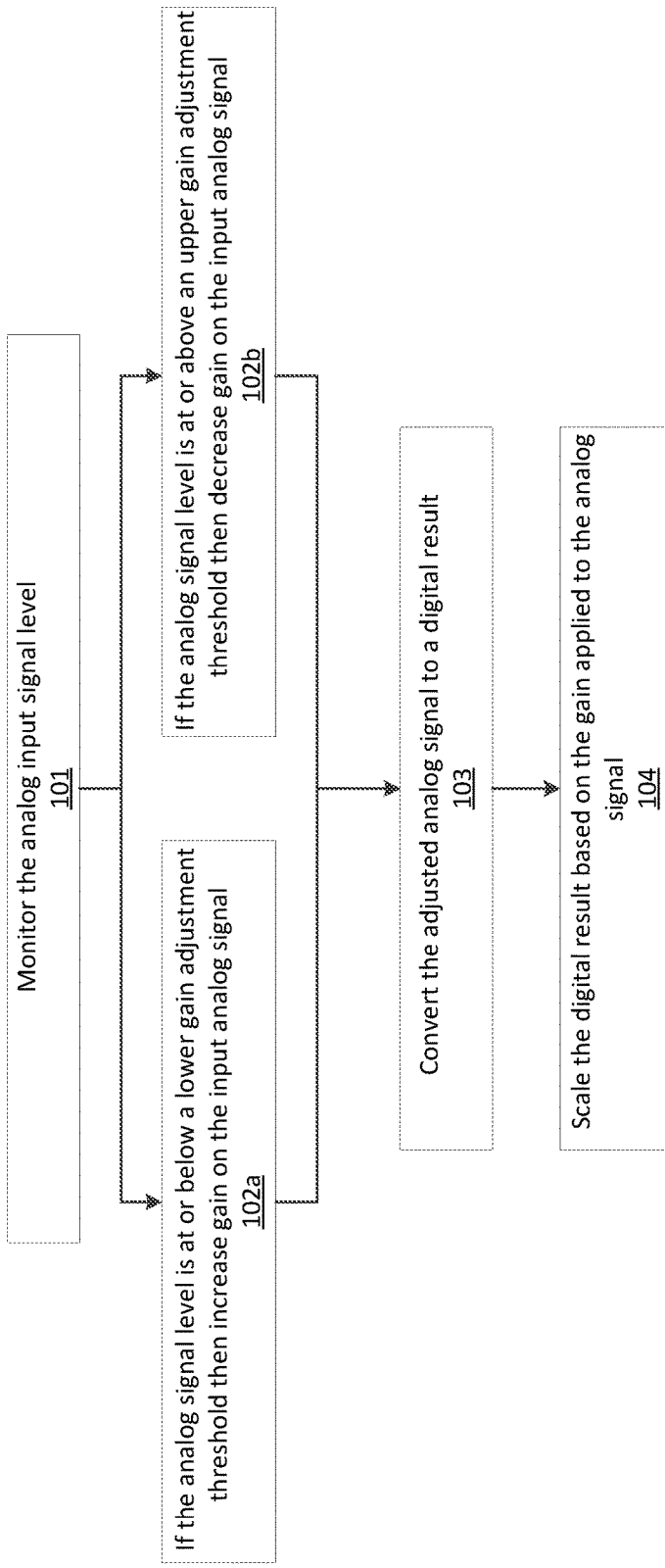
FIG. 3A shows an autonomous gain adjustment process in accordance with an embodiment of the disclosure.

FIG. 3A shows an autonomous gain adjustment process 100, in accordance with an embodiment of the disclosure. The autonomous gain adjustment process 100 may be performed in conjunction with a system 2 (FIG. 2), in accordance with embodiments of the disclosure. An input signal level is observed, in operation 101. If the input signal level is at or below a lower gain adjustment threshold then the gain is increased on the input signal, in operation 102a. If the input signal level is at or above an upper gain adjustment threshold then the gain is decreased on the input signal, in operation 102b. In various embodiments, a gain may be selected from among available/optional gains, where the selected gain provides an adjusted input signal level that is within an ADC's dynamic range. The adjusted input signal is converted to a digital result, in operation 103. The digital result is scaled down based on the gain applied to the analog signal, in operation 104.

Notably, in the autonomous gain adjustment process 100 the adjusted analog signal may have the same level as the input signal if the gain is =1x. If the gain applied to the adjusted input signal is =1x then the digital result will not be scaled down.

Figure 3B:
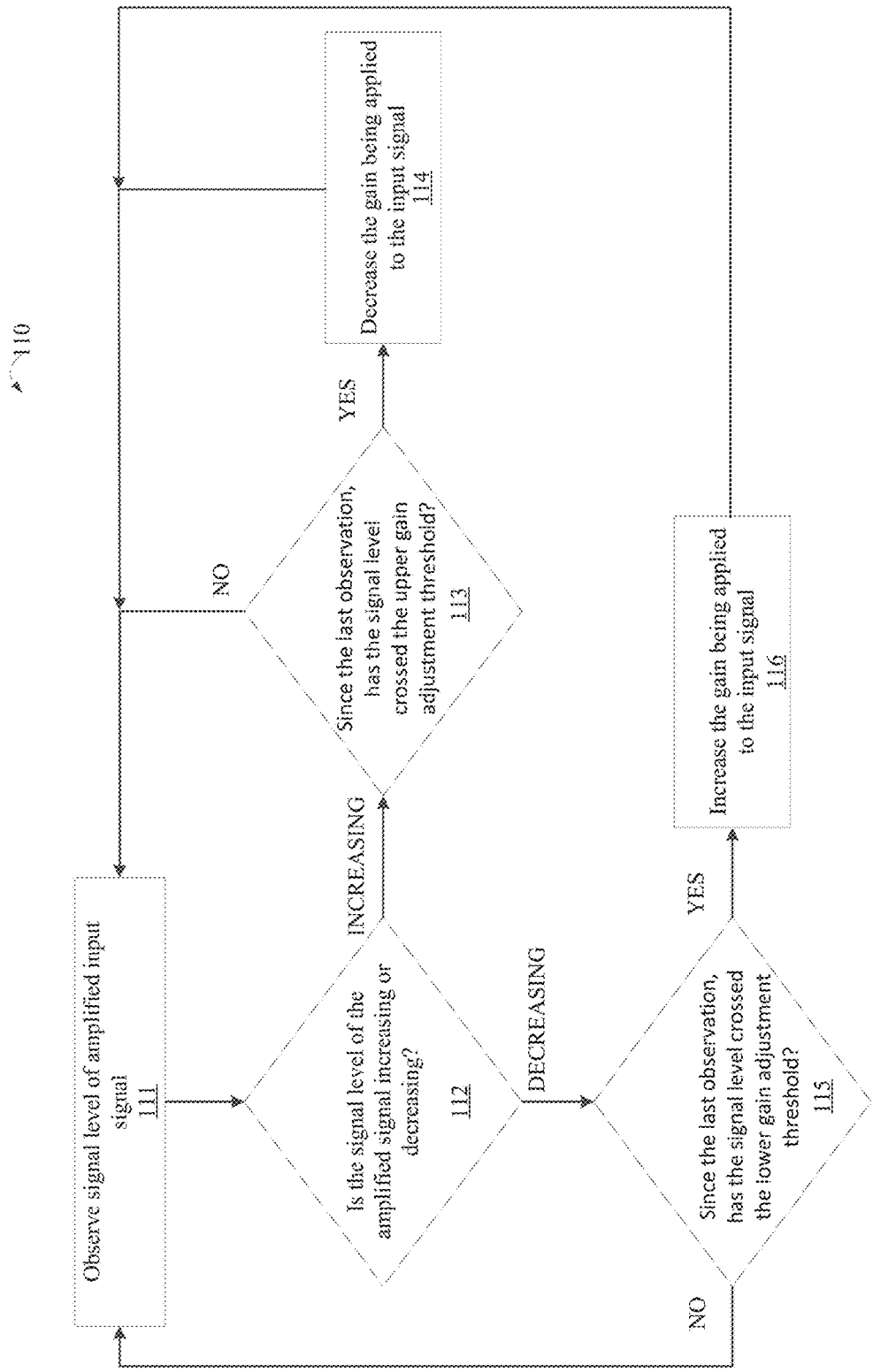
FIG. 3B shows a process for determining gain adjustments, in accordance with one or more embodiments of the disclosure.

FIG. 3B shows a process 110 for determining gain adjustments, in accordance with one or more embodiments of the disclosure. In operation 111, a signal level of an amplified input signal is observed. In operation 112, it is determined if the signal level of the amplified signal is increasing or decreasing. In one embodiment, the current signal level observation may be compared to the immediately previous signal level observation to determine if the signal level is increasing or decreasing. If the signal level is increasing, in operation 113, it is determined if the signal level crossed the upper gain adjustment threshold since the last observation. In one embodiment, a crossing may be determined if the immediately previous signal level observation is less than or at the gain adjustment threshold and the current signal level observation is at or above the gain adjustment threshold. If a crossing is not detected, then the gain is not adjusted. If a crossing is detected, then in operation 114, the gain being applied to the input signal is decreased.

If it is determined that the signal level is decreasing, in operation 115, it is determined if the signal level crossed the gain adjustment threshold since the last observation. In one embodiment, a crossing may be determined if the immediately previous single level observation is at or higher than the gain adjustment threshold and the current signal level observation is at or less than the gain adjustment threshold. If a crossing is not detected, then the gain is not adjusted. If a crossing is detected, then in operation 116, the gain being applied to the input signal is increased.

In one or more embodiments, the upper gain adjustment threshold and lower gain adjustment threshold may be the same or different. In some embodiments it is specifically contemplated that a single gain adjustment threshold is used to determine if the gain should be increased or decreased.

Notably, the signal levels of an input signal and an amplified signal may be the same when the gain=1 or is unity gain. In one or more embodiments, initially, the input signal and amplified signal will have the same amplitude. In other embodiments, initially, a signal level of the input signal may be expected and a gain may be applied to the initially received input signal.

Figure 4:
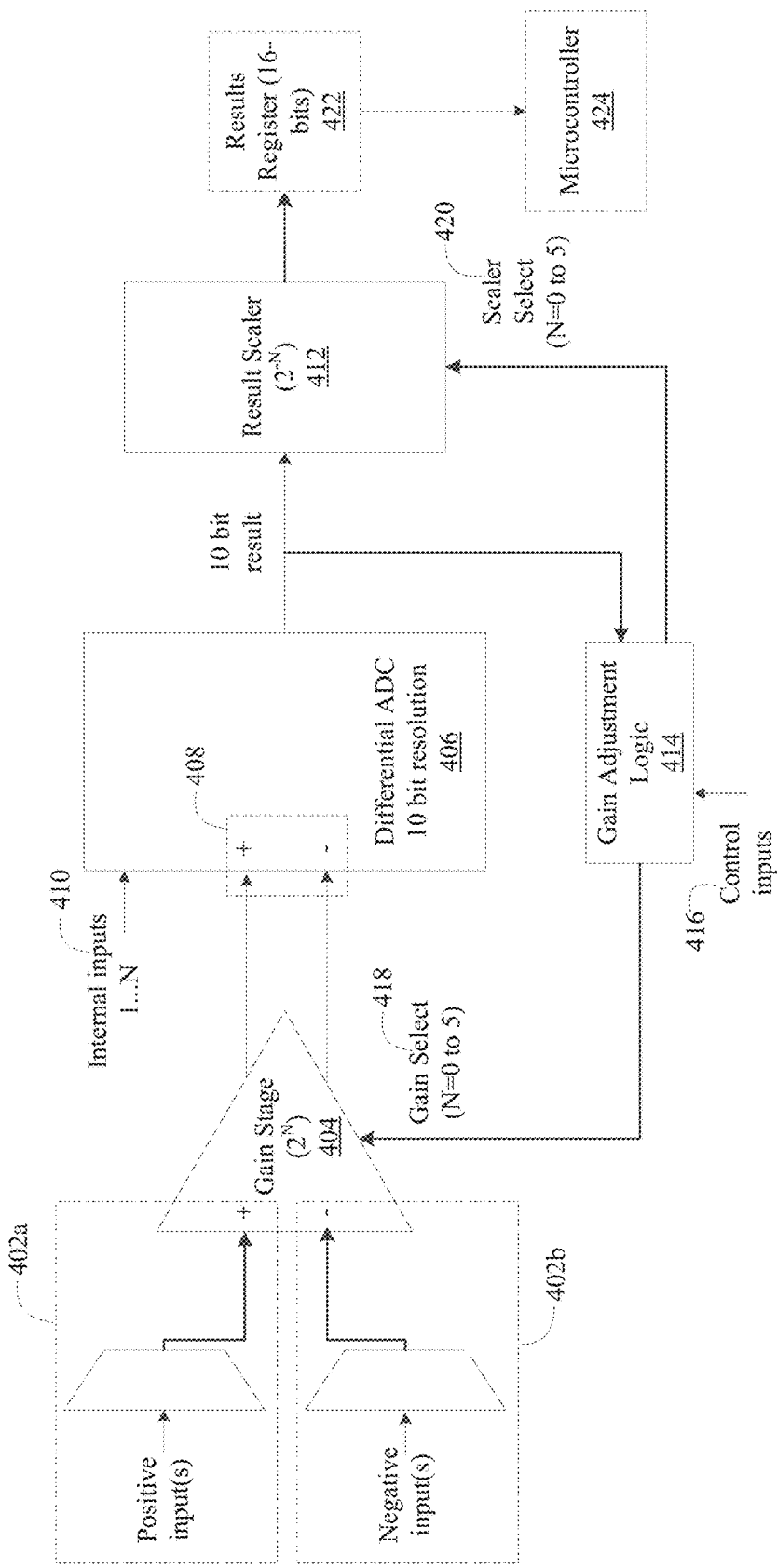
FIG. 4 shows an implementation of an ADC circuit with autonomous analog gain stage and auto digital result scaling, in accordance with an embodiment of the disclosure.

FIG. 4 shows an implementation of an analog to digital converter with autonomous gain stage and gain adjustment, in accordance with embodiments of the disclosure. The differential ADC 406 is a 10-bit ADC coupled to an adjustable gain stage 404; however, one of ordinary skill in the art will understand that any resolution ADC may be used. In another embodiment the differential ADC 406 may be a multi-stage pipelined ADC. The differential ADC 406 is a differential ADC that includes a differential input 408 (e.g., negative and positive), and for single-ended measurements a negative input of the differential input 408 of the ADC may be coupled to a fixed internal value. In another embodiment, a single ended ADC may be used. The differential ADC 406 may support other functions, including functions that do not use gain, and thus a gain enablement may be included (not shown). The differential ADC 406 may include a number of internal inputs 410, including a voltage reference (Vref), and may include additional internal inputs, e.g., a temperature sensor.

In one embodiment, a gain adjustment logic 414 may be coupled to the differential ADC 406, gain stage 404 and result scaler 412. Gain adjustment logic 414 may be configured to digitally monitor the result output from the differential ADC 406, and to configure a gain select 418 of the gain stage 404 and a scaler select 420 of the result scaler 412. The gain adjustment logic 414 may include one or more control inputs 416 to configure the operation of the gain adjustment logic 414. In one embodiment, the gain adjustment logic 414 is a configurable state machine with memory.

In one embodiment, the gain stage 404 may be configured to directly amplify an analog input signal, and may be or may include, for example, one or more operational amplifiers. The gain stage 404 may include differential inputs 402a and 402b, for example, receiving positive inputs and negative inputs.

The result register 422 may be a 16-bit register coupled to the result scaler 412. When the 10-bit differential ADC 406 has unity gain (×1) its maximum value will use all bits in the result register 422, which, in this example, is 16 bits. The lower 4 bits are not used for unity gain. However, if the analog signal level is at or below a lower gain adjustment threshold then the gain may be autonomously increased (e.g., doubled), and the digital result scaled down accordingly to compensate for the analog gain. Further, if the analog signal level is at or above an upper gain adjustment threshold then the gain may be autonomously decreased (e.g., halved), and the digital result scaled down accordingly to compensate for any analog gain (unless the gain=1× in which case the digital result is not scaled down).

The result register 422 may be coupled to, accessible by, or part of a microcontroller 424 with integrated non-volatile memory. Multiple inputs of the microcontroller 424 may incorporate an analog to digital converter with autonomous gain stage and gain adjustment. In one embodiment, the microcontroller 424 includes one or more peripherals that incorporate an analog to digital converter with autonomous gain stage and gain adjustment in accordance with embodiments of the disclosure.

Figure 5:
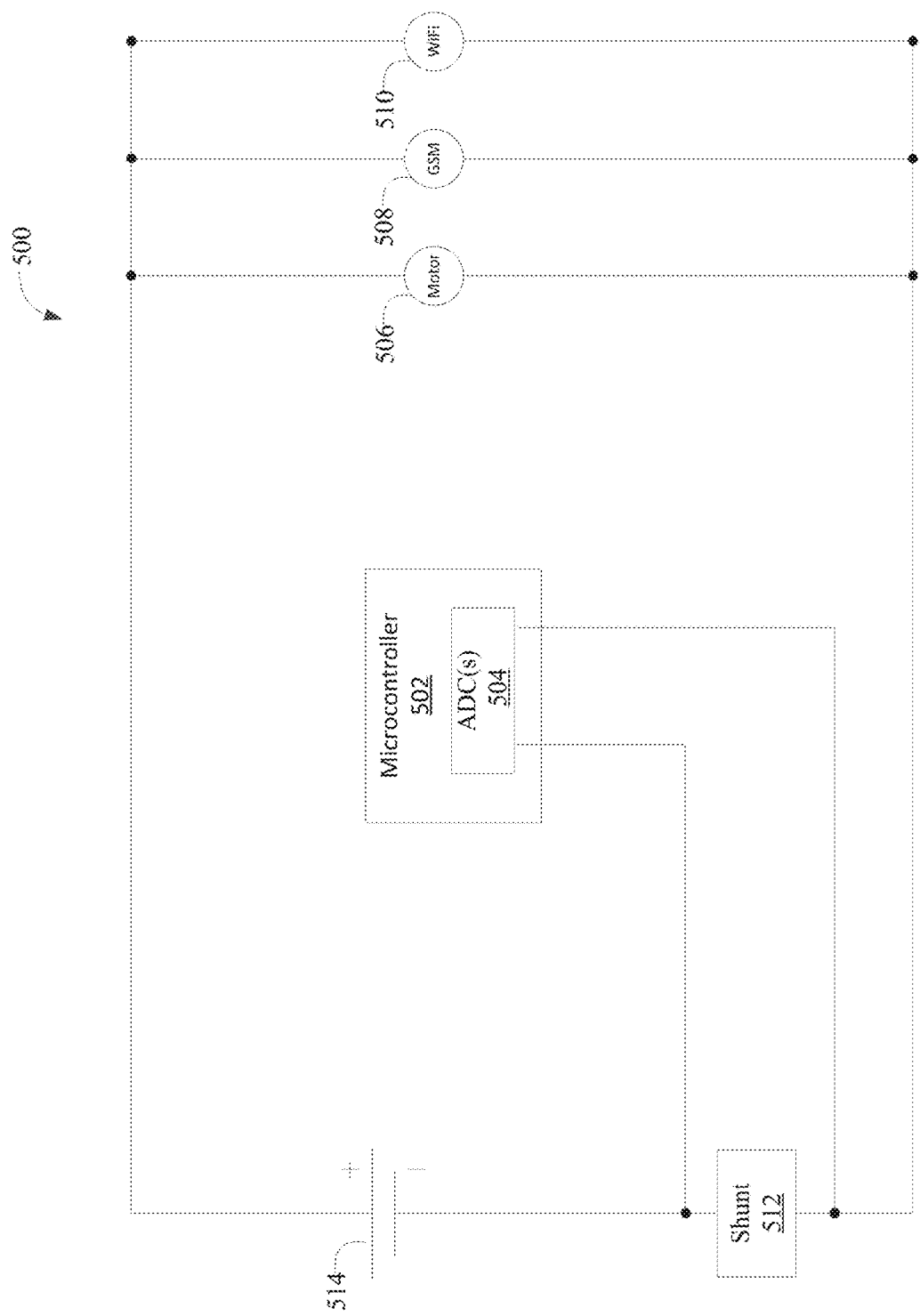
FIG. 5 shows an exemplary process of monitoring a battery that incorporates an ADC circuit with autonomous analog gain stage and auto digital result scaling, in accordance with embodiment of the disclosure.

FIG. 5 shows a battery monitoring system 500 having an embedded microcontroller 502 that performs a battery monitoring application, wherein the embedded microcontroller 502 incorporates an ADC(s) 504 with autonomous gain stage and gain adjustment, in accordance with embodiments of the disclosure. The embedded microcontroller 502 is configured to measure the current into, and out of, a battery and estimate the remaining the battery life or provide the measurements to a software application that estimates remaining battery life. The embedded microcontroller 502 may be configured to measure current into and out of a motor 506, a GSM (global system for mobile communication) connected actuator 508, and a Wi-Fi antenna 510 in a drone. One of ordinary skill in the art will recognize that the embedded microcontroller 502 that incorporates ADCs 504 with autonomous gain adjustment may be incorporated into any device that has power consuming components that are sensitive to battery life, for example, a mobile phone (e.g., antenna, display), a drone (e.g., motor, GSM connected actuator), a pace maker or other medical device (e.g., electrical impulse generator), etc.

Figure 6:
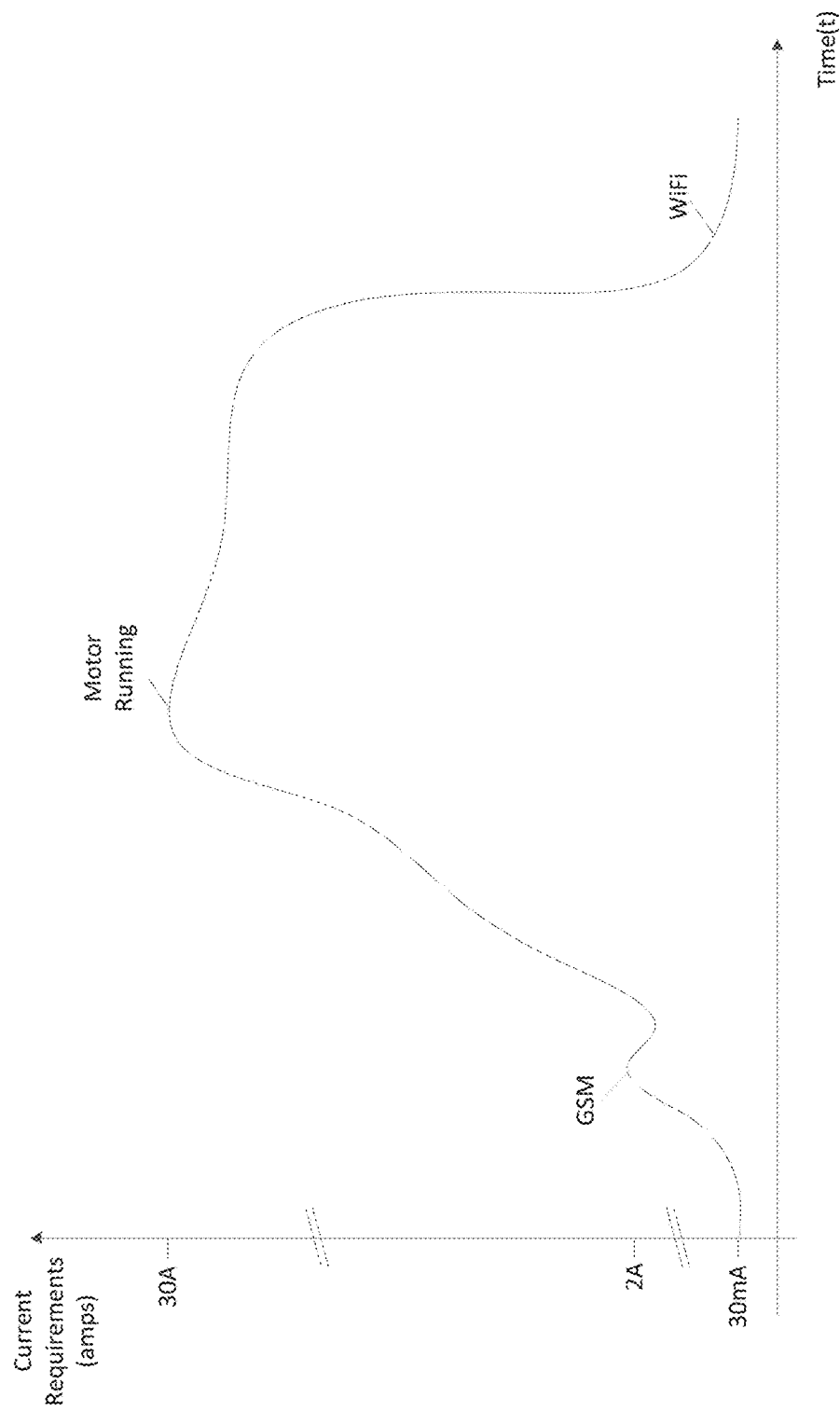
FIG. 6 shows an analog signal from the system of FIG. 5.

FIG. 6 shows the dynamic range within which the embedded microcontroller 502 and associated ADC 504 operate in the battery monitoring system of FIG. 5. A typical standby current for a motor 506 may be 30 mA and the max current during high power consumption by a motor 506 may be 30 A. For a GSM connected actuator 508 the current when the GSM is active may be around 2 A. For the Wi-Fi antenna 510 the current when the antenna is active is about 30 mA. So, the dynamic range within which the embedded microcontroller 502 operates may be about 30 mA to 30 A.

Figure 7A:
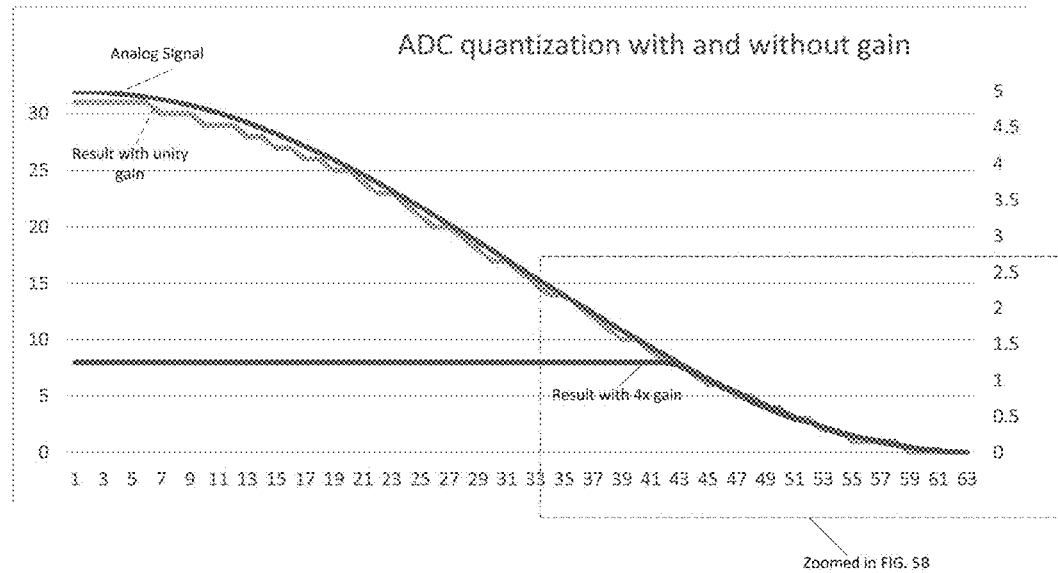
FIGS. 7A and 7B show examples of a gain adjustment process in accordance with an embodiment of the disclosure.
Figure 7B:
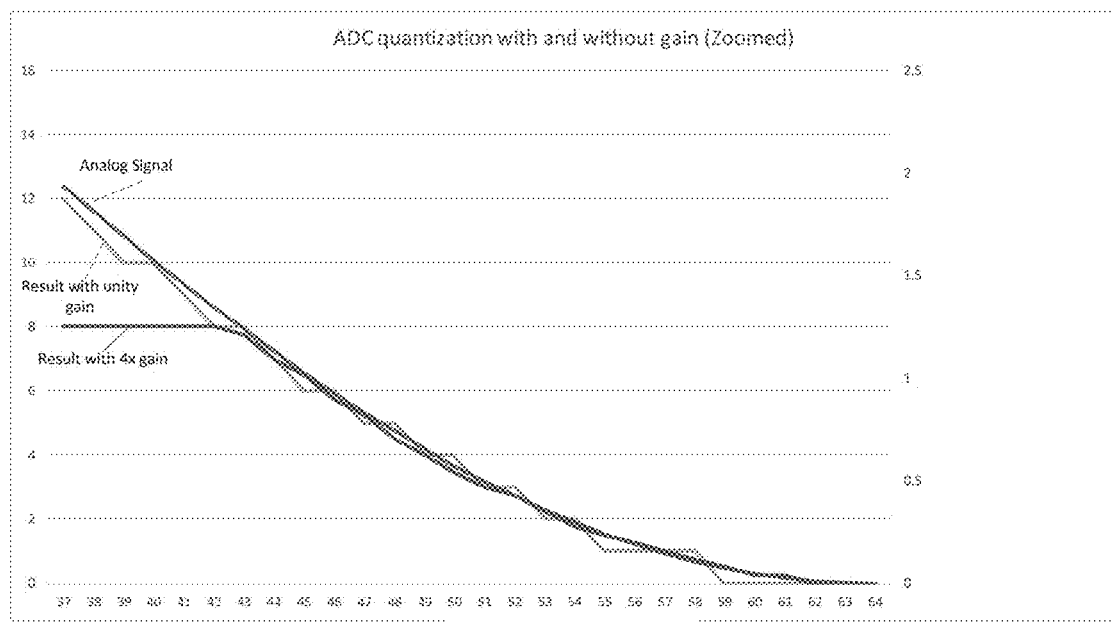

FIGS. 7A and 7B show examples of a gain adjustment process in accordance with an embodiment of the disclosure. To measure and monitor the battery a desired resolution may be, e.g., about 1 mA or better, thus, there would be 30,000 steps in the 30 mA to 30 A range. However, the ADC 504 is a 12-bit ADC and has 4,096 steps, so the resolution at unity gain is coarse compared to the analog signal.

As shown in FIG. 7B, when the gain adjustment starts about time slot 43, a 4× gain is applied which enables the ADC 504 to measure signal resolution down to about 1.25 mA while still being able to measure up to 30 A. A 64× gain would enable the ADC 504 to measure the signal resolution down to about 100 uA while still being able to measure up to 30 A.

One of ordinary skill in the art will recognize many advantages and benefits from the embodiments described herein, including over conventional ADCs with internal programmable gain stages.

One advantage of an ADC with AAGS and ADRS is that that ADC's are typically calibrated and optimized to an input signal level at or near a reference signal level. Thus, an ADC with AAGS and ADRS operates under ideal conditions for measuring the signal at any given time, providing high quality resolution and dynamic range.

One advantage of an ADC with AAGS and ADRS is the adjustment of the gain of the AAGS cycle by cycle without involving a CPU at a signal level. If an input signal level is high (i.e., at the upper end of the dynamic range of the ADC) then the ADC with AAGS will automatically reduce the gain, and if the signal level is low (i.e., at the lower end of the dynamic range of the ADC) then it will automatically increase the gain without any intervention from a CPU.

One of ordinary skill in the art will understand that the principles described herein are applicable to, and may be implemented in, digital-to-analog converters as well as analog-to-digital converters.

In one embodiment, the ADC with AAGS and ADRS is incorporated as a core independent peripheral of a microcontroller. In one embodiment the ADC with AAGS and ADRS may be coupled to an event system bus. Additional details regarding one type of event system and event bus, as well as overall microcontroller system configurations, may be found in U.S. Pat. No. 9,256,399 entitled "BREAKING PROGRAM EXECUTION ON EVENTS" filed on Jun. 27, 2013, the disclosure of which is incorporated herein in its entirety by this reference.

In applications that require a high sample rate, it is not practical to perform gain adjustment for a peripheral at a CPU of a microcontroller. And more specifically, for data acquisition applications that involve post-processing and frequent data output or interrupts (e.g., of another peripheral), using CPU time would delay other processes managed at the microcontroller and may introduce latency due to involving the CPU, and, more generally, significantly reduce computational efficiency of the system. So, one or more embodiments relate, generally, to an autonomous processing unit of a microcontroller. In one or more embodiments, the autonomous processing unit may be a peripheral of a microcontroller. A peripheral that includes an autonomous processing unit may also be characterized as a "core independent peripheral," that is, configured to perform at least some (or all) functions without requiring time from the processing core(s) of the microcontroller. So, the microcontroller is able to run fewer control loops (as compared to an MCU that includes a CPU-dependent processing unit), with fewer opportunities to miss interrupts from competing input signals.

Figure 8:
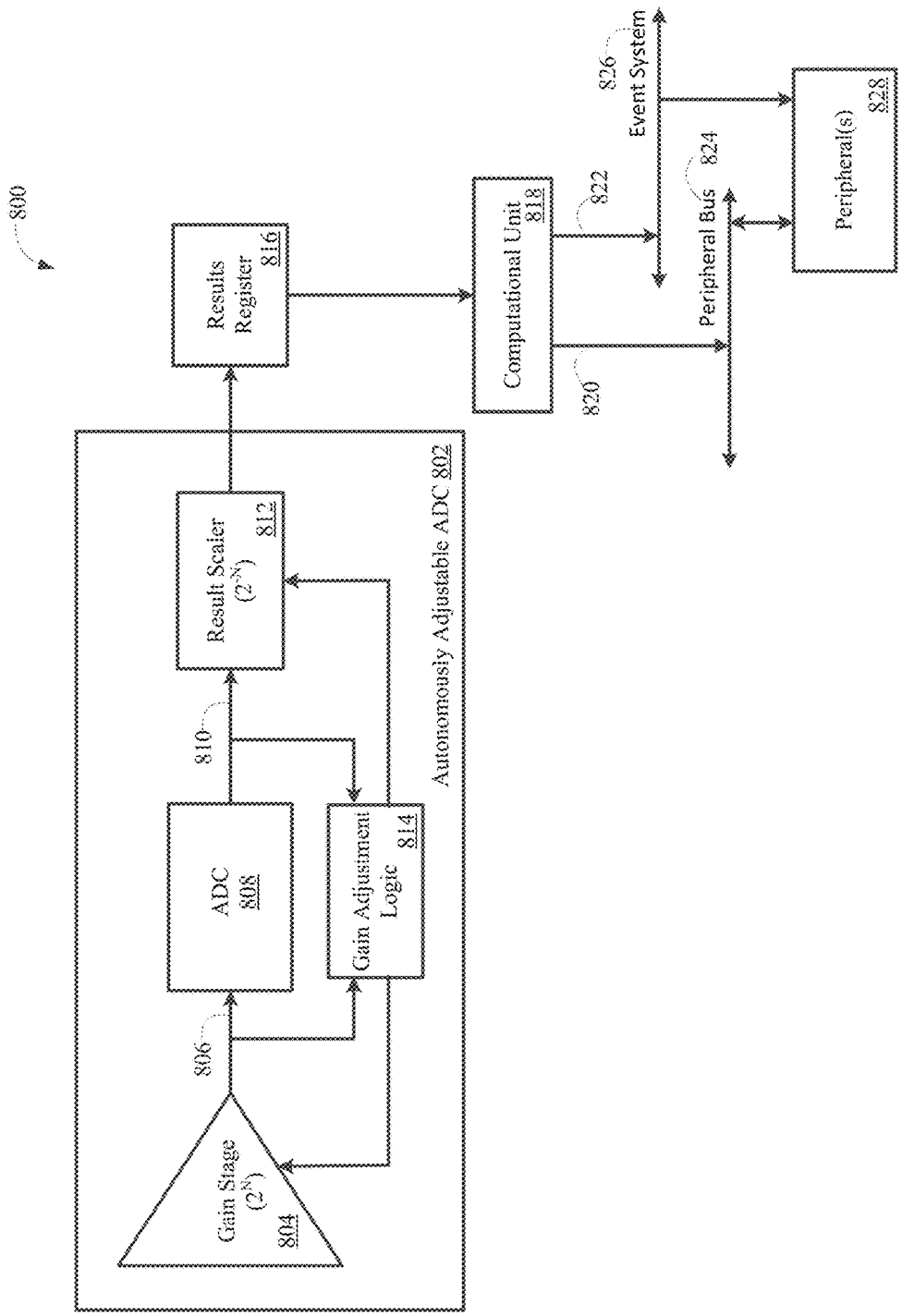
FIG. 8 shows a functional block diagram of an autonomous processing unit, in accordance with one or more embodiments of the disclosure.

FIG. 8 shows a functional block diagram of an autonomous processing system 800, in accordance with one or more embodiments of the disclosure. In one or more embodiments, autonomous processing system 800 may include autonomously adjustable ADC 802, result register 816, and computational logic unit 818. Result register 816 may be operatively coupled to the autonomously adjustable ADC 802 and configured to receive a digital signal. Computational logic unit 818 may be operatively coupled to result register 816 and configured to receive one or more data bits stored at result register 816.

Autonomously adjustable ADC 802 may be configured according to any one or more of the embodiments of analog-to-digital converters with adjustable gain stages, result scalers, and gain logic of this disclosure, and, generally, may include gain stage 804, ADC 808, gain adjustment logic 814, and result scaler 812. Gain adjustment logic 814 may be configured to receive ADC input 806 and/or ADC output 810, and provide gain select and scaler select to gain stage 804 and result scaler 812, respectively.

Computational logic unit 818 may be configured to output one or more computational results (e.g., data signals) responsive to processing logic. In one or more embodiments, computational logic unit 818 may include, by way of non-limiting example, registers and/or digital logic circuitry configured to generate computational results responsive to one or more bits stored at registers (e.g., a register of the computational logic unit 818, results register 816, and/or combinations thereof). In one or more embodiments, computational logic unit 818 may be a configurable state machine configured to generate results responsive to one or more detectable conditions, for example, responsive to data bits at results register 816. By way of non-limiting example, computational logic unit 818 may implement a comparator, a timer/counter, if-then-else logic, arithmetic (e.g., adding, averaging, etc.) and combinations thereof.

In one or more embodiments, computational logic unit 818 may be configured to generate computational results 820 and 822 responsive to one or more operations. Some or all of the operations may be performed entirely at the computational logic unit 818 without input from a CPU (e.g., of a microcontroller). Moreover, the computational logic unit 818 does not require capability (e.g., logic, circuits, etc.) to enable it to be "aware" of an ADC at its input, at least in part, because the autonomously adjustable ADC 802 handles input signals independently.

In one or more embodiments, autonomous processing system 800 may provide results 820 and/or 822 to peripheral bus 824 and event system 826, respectively. In this manner, autonomous processing system 800 may be configured to communicate with one or more peripherals 828 and the microcontroller CPU, as well as execute one or more control loops with other peripherals 828 without interrupting the CPU of the microcontroller.

Peripherals 828 may be configured for, by way of non-limiting example, pulse-width-modulation, single-shot generation, interrupts (e.g., periodic, event driven), input capture, time and frequency measurement of analog and digital signals, noise cancellation, and combination thereof. In one or more embodiments, any one or more of the foregoing peripheral functions may be triggered by event system 826 responsive to results 822, and/or may be triggered directly responsive to results 820 included in messages provided by autonomous processing system 800 to peripheral bus 824.

One aspect of autonomous processing system 800 is that autonomously adjustable ADC 802 may be optimized by gain adjustment logic 814 and gain stage 804 for an optimal number of bits. The optimal number of bits may be a function of the amplitude of an input signal and/or the dynamic range of computational logic unit 818. For example, if computational logic unit 818 requires 16-bit resolution on a low-amplitude signal (e.g., 10 v), and ADC 808 is configured for 8-bit resolution, gain adjustment logic 814 and gain stage 804 may optimize autonomously adjustable ADC 802 for 16-bit resolution by amplifying the input signal, and monitoring and adjusting the amplified signal to keep it from saturating the ADC 808. Moreover, autonomously adjustable ADC 802 may be optimized without interrupting processing cores of an embedded system, nor does the computational logic unit 818 need to perform any optimization on the input signal. Computational logic unit 818 may be agnostic to the ADC's constraints while conventional computational units have to monitor and configure the ADC.

Figure 9:
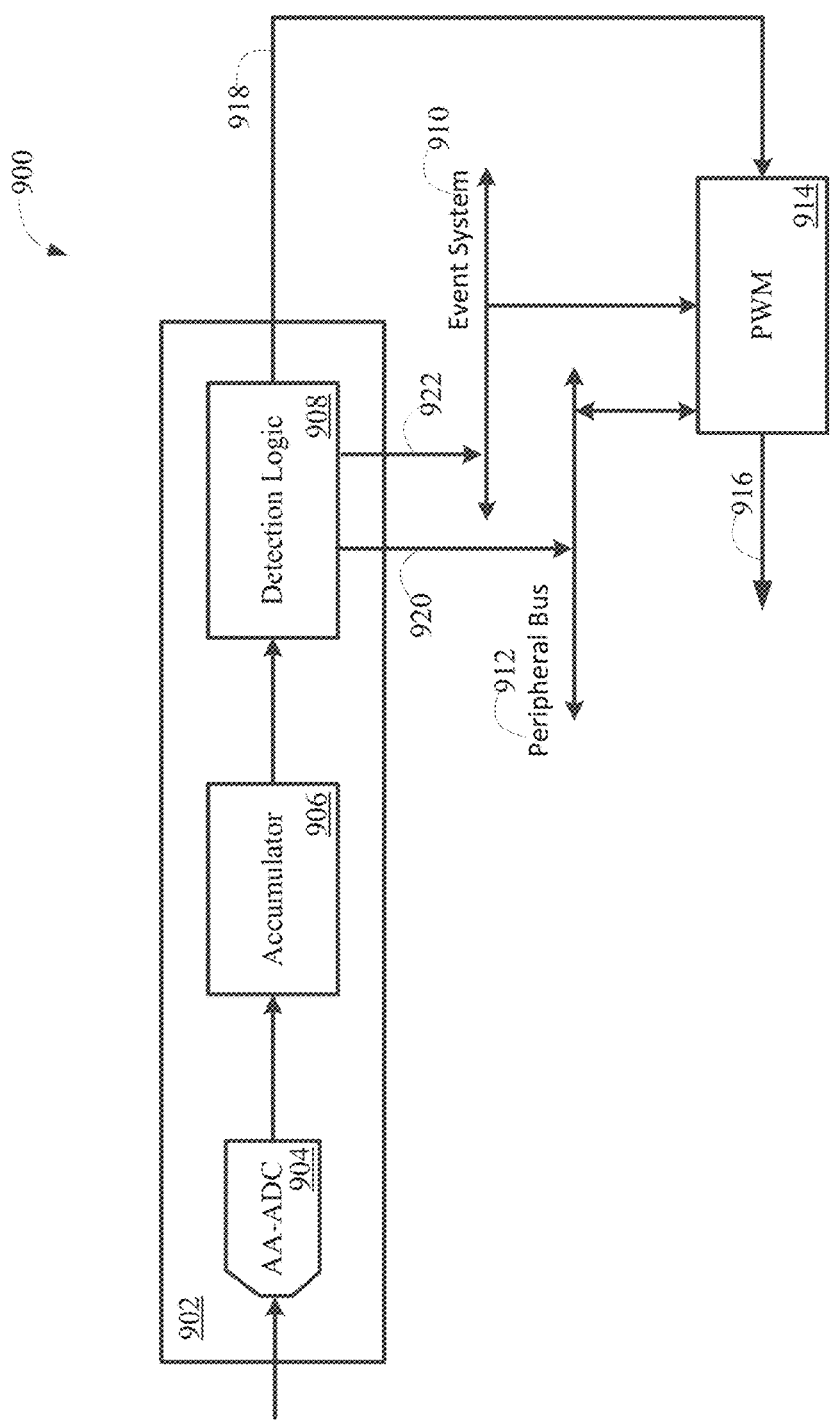
FIG. 9 shows a functional block diagram of an autonomous battery monitoring control system, in accordance with one or more embodiments of the disclosure.

Various autonomous control loops may be enabled by autonomous processing units of the disclosure. One or more monitored operations may be changed responsive to the control loops, for example, motors, antenna power, etc. For example, FIG. 9 shows a functional block diagram of an autonomous battery monitoring control system 900, in accordance with one or more embodiments of the disclosure. In one or more embodiments, autonomous battery monitoring control system 900 may be configured to measure current drawn from a battery, such as current from battery 514 that passes through shunt 512 of FIG. 5, and generate one or more control signals 916 responsive to the measured current.

In one or more embodiments, autonomous battery monitoring control system 900 may include autonomous detection unit 902 and pulse-width-modulator (PWM) 914. Autonomous detection unit 902 may be configured to communicate with PWM 914 by one or more of a peripheral bus 912, event system 910, and/or interrupts 918. In one or more embodiments, autonomous detection unit 902 may include an autonomously adjustable ADC 904, accumulator 906, and detection logic 908. Accumulator 906 may include one or more registers and adders for adding a sequence of current measurements output from the autonomously adjustable ADC 904. In one or more embodiments, the input signal autonomously sampled by the autonomously adjustable ADC 904 may be received from one or more input/output (I/O) pins of a microcontroller, for example, I/O pins configured for general purpose IO (GPIO), pins configured to be event system inputs, and combinations thereof.

The detection logic 908 may be configured to receive current measurements from the accumulator 906 and output one or more results responsive to the received current measurements. In one embodiment, the detection logic 908 may be configured to compare current measurements to one or more thresholds, and generate detection results (e.g., results indicative of a current measurement being above or below a threshold) responsive to the comparison. In another embodiment, the detection logic 908 may be configured to determine an average current measurement responsive to received current measurements over time intervals, and generate detection results responsive to the determination. The autonomous detection unit 902 may be configured to provide (or make available) the detection results 920 and 922 to one or more of the event system 910 and/or peripheral bus 912, respectively.

In one or more embodiments, event system 910 may be configured to generate one or more PWM events responsive to detection results 922. For example, if detection results 922 are indicative of a high current (e.g., current measurement was above an upper threshold) then the event system 910 may be configured to cause a reduction of the amount of current being drawn from a battery. If detection results 922 are indicative of a low current (e.g., current measurement was below a lower threshold) then event system 910 may be configured to not do anything, send a normal state, etc. In one or more embodiments, PWM 914 may be configured to pulse-width-modulate a control signal 916 responsive to control signals received from event system 910.

In another embodiment, autonomous detection unit 902 may be configured to generate one or more interrupts 918 at PWM 914 responsive to one or more detection results 922. The PWM 914 may be configured to adjust control signals 916 responsive to interrupts 918. In one embodiment, PWM 914 may adjust control signal 916 in a manner configured to reduce the amount of current being drawn from a battery.

Figure 10:
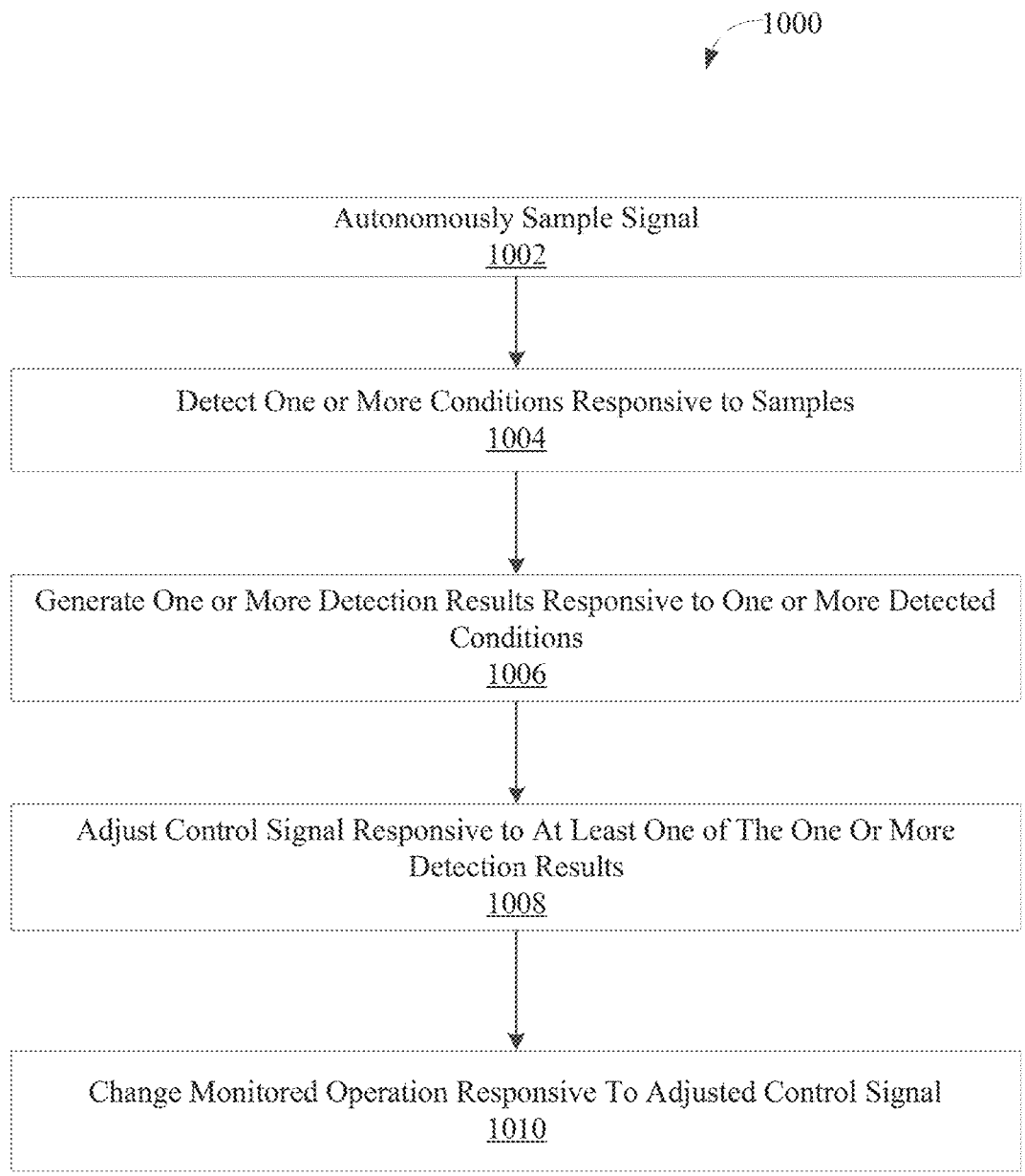
FIG. 10 shows a flowchart of an autonomous control process, in accordance with one or more embodiments of the disclosure.

FIG. 10 shows a flowchart of an autonomous control process 1000, in accordance with one or more embodiments of the disclosure. In operation 1002, an input signal is autonomously sampled by autonomously adjustable ADC 904. In one or more embodiments, the input signal may be a current, voltage, frequency, or combinations thereof. The samples may be accumulated at an accumulator 906 and read by detection logic 908. In operation 1004, one or more conditions may be detected responsive to the samples. By way of non-limiting example, the one or more conditions may include exceeding a threshold, an average sample value, etc. In operation 1006, one or more detection results may be generated responsive to one or more of the detected conditions. Detection results may include any suitable form for indicating a detected condition known to one of ordinary skill in the art (e.g., an error signal, a digital value, etc.). In operation 1008, a control signal is adjusted responsive to the one or more detection results. The adjustment may be configured to result in a specific operational change or range of changes, in a device or process. In operation 1010, a monitored operation may change responsive to the adjusted control signal.

One or more embodiments of the disclosure relate to a microcontroller that includes an ADC with autonomous gain adjustment, where the gain adjustment is realized internally to a microcontroller package. This architecture is more compact than an architecture where a gain stage is outside the microcontroller package, for example, where a gain stage receives at an input a signal of interest and an output of the gain stage is connected to a GPIO pin.

Figure 11:
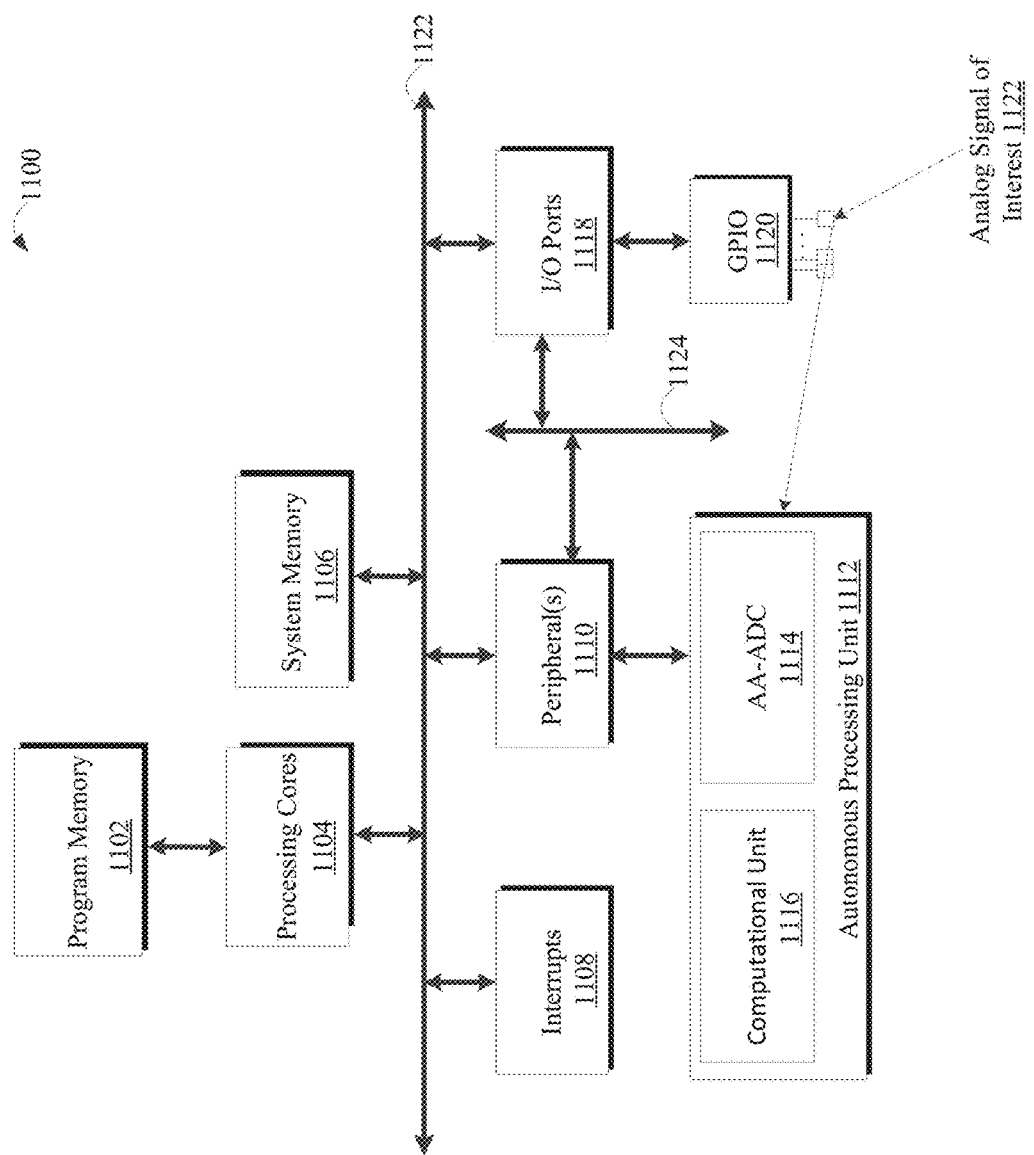
FIG. 11 shows a functional block diagram of a microcontroller, in accordance with one or more embodiments of the disclosure.

FIG. 11 shows a block-diagram of a microcontroller 1100, in accordance with one or more embodiments of this disclosure. Microcontroller 1100 includes processing cores 1104, system memory 1106, interrupts 1108, peripheral(s) 1110, and I/O ports 1118, each operatively coupled to bus 1122. Processing cores 1104 may be configured to perform one or more operations based on software instructions stored in the program memory 1102 and data stored in system memory 1106. Bus 1122 may be any suitable type of bus, including I2C, SPI, USB, and CAN. I/O ports 1118 may include any number of general purpose I/O ports (GPIO) 1120 and special purpose I/O ports (not shown).

Peripherals 1110 may include any of a number and type of peripherals, for example, ADC's, timers, math units, USART, and more. Here, peripherals 1110 include an autonomous processing unit 1112, which includes an AA-ADC 1114 operatively coupled to a computational unit 1116. Computational unit 1116 may be configured to perform one or more operations and may include, for example, a comparator, an adder, etc., and a register for storing a result.

In one or more contemplated operations, an analog signal of interest 1122 may be received at one of the pins of GPIO 1120. In one or more embodiments, the pin and signals asserted at it may be specifically monitored by autonomous processing unit 1112. The ADC of AA-ADC 1114 may be configured for a step size that is insufficient for the dynamic range of the computational unit 1116. By way of example, computational unit 1116 may require a 16-bit resolution on an analog signal of interest 1122 with a 10 v range (i.e., ±5 volts), and the ADC of AA-ADC 1114 may provide less resolution, e.g., 8-bit resolution. In other words, the computational unit 1116 may require the ADC to resolve 20 mV changes in the analog signal, but the ADC may only be able to resolve 40 mV changes.

Accordingly, AA-ADC 1114 may be configured to increase the amplitude of the analog input signal so that a 20 my change at the input signal of interest 1122 results in at least a 40 my change at the amplified input signal to an ADC of AA-ADC 1114. Moreover, if the signal level of the amplified input signal crosses above a gain adjustment threshold associated with the AA-ADC 1114, the AA-ADC 1114 is configured to adjust the gain to decrease the amplification of the input signal of interest so that a further increase in the amplified signal will not exceed the dynamic range of the ADC. If the signal level of the amplified input signal crosses below a gain adjustment threshold associated with the AA-ADC 1114, the AA-ADC 1114 is configured to adjust the gain to increase the amplification of the input signal. The AA-ADC 1114 may be configured to scale a digital output signal to match the dynamic range of the computational unit 1116.

One or more descriptions of embodiments of the disclosure may include a data bus or communication over a data bus or a data path, more generally. One or more embodiments of the disclosure may incorporate interfaces to allow various elements to provide data to a data bus, and, more generally, to enable communication over a data bus. The data may be communicated as messages and using any appropriate protocol.

Many of the functional units described in this specification may be illustrated, described or labeled as modules, threads, or other segregations of programming code, in order to more particularly emphasize their implementation independence. Modules may be at least partially implemented in hardware, in one form or another. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

Additional non-limiting embodiments of the disclosure include:

Embodiment 1

A microcontroller system, comprising: a central processing unit; one or more input/output (I/O) connectors configured to receive an input signal; an autonomously adjustable analog-to-digital converter (ADC) configured to: amplify the input signal responsive to a desired number of bits of resolution; observe a signal level of the amplified input signal; adjust, responsive to the observed signal level, an amplification parameter to keep the amplified signal within a pre-defined dynamic range of the autonomously adjustable ADC; sample the amplified input signal at the desired number of bits of resolution; provide a digital output signal responsive to the amplified signal, and a computational unit configured to provide one or more computational results responsive to the digital output signal.

Embodiment 2

The microcontroller system of Embodiment 1, wherein the computational unit comprises processing logic circuitry configured to determine the one or more computational results, the processing logic circuitry configured to perform one or more of threshold detection, arithmetic, and comparisons.

Embodiment 3

The microcontroller system of any of Embodiments 1 and 2, wherein the processing logic circuitry is a configurable state machine.

Embodiment 4

The microcontroller system of any of Embodiments 1 through 3, wherein the computational unit comprises one or more of a comparator, a timer, a counter, if-then logic, arithmetic, addition, subtraction, multiplication, division, and averaging.

Embodiment 5

The microcontroller system of any of Embodiments 1 through 4, wherein the autonomously adjustable ADC is operatively coupled to at least one I/O connector of the one or more I/O connectors such that the autonomously adjustable ADC directly receives the input signal from the one or more I/O connectors.

Embodiment 6

The microcontroller system of any of Embodiments 1 through 5, wherein the at least one I/O connector is a general purpose input/output connector.

Embodiment 7

The microcontroller system of any of Embodiments 1 through 6, wherein the autonomously adjustable analog-to-digital converter (ADC) comprises: a gain stage circuitry; an ADC circuitry having at least one input coupled to at least one output of the gain stage circuitry; a scaler circuitry coupled to at least one output of the ADC circuitry; and a gain adjustment logic circuitry configured to: measure a signal level of an ADC input signal; compare the measured signal level to a gain adjustment threshold and responsive to the comparison: configure a gain of the gain stage circuitry; and configure a scaling component of the scaler circuitry, wherein the scaling component is proportional to the gain of the gain stage circuitry.

Embodiment 8

The microcontroller system of any of Embodiments 1 through 7, further comprising one or more peripheral devices.

Embodiment 9

The microcontroller system of any of Embodiments 1 through 8, further comprising a peripheral bus configured to enable a first peripheral device of the one or more peripheral devices to communicate with a second peripheral device.

Embodiment 10

The microcontroller system of any of Embodiments 1 through 9, wherein the computational unit comprises an interface configured to be coupled to the peripheral bus, and wherein the computational unit is configured to provide the one or more computational results to the interface.

Embodiment 11

The microcontroller system of any of Embodiments 1 through 10, further comprising an event system, wherein the event system is configured to provide one or more events responsive to the one or more computational results.

Embodiment 12

The microcontroller system of any of Embodiments 1 through 11, wherein the event system comprises event logic configured to trigger a detection event of the one or more events responsive to a computational result of the one or more computational results, wherein the computational result is indicative of a threshold detection at the one or more peripheral devices.

Embodiment 13

The microcontroller system of any of Embodiments 1 through 12, wherein the event system comprises event logic configured to trigger a detection event of the one or more events responsive to a computational result of the one or more computational results and a threshold condition.

Embodiment 14

The microcontroller system of any of Embodiments 1 through 13, wherein the event system comprises configurable event system logic.

Embodiment 15

The microcontroller system of any of Embodiments 1 through 14, wherein the central processing unit is configured to perform a main control loop, and a first peripheral device of the one or more peripheral devices and the computational unit are configured to perform a second control loop.

Embodiment 16

The microcontroller system of any of Embodiments 1 through 15, wherein the first peripheral device and the computational unit are configured to perform the second control loop while the central processing unit performs the main control loop and without interrupting the main control loop.

Embodiment 17

The microcontroller system of any of Embodiments 1 through 16, wherein the first peripheral device is configured to perform one of pulse-width modulation, single-shot generation, periodic interrupts, event-driven interrupts, input capture, time measurement of analog signals, frequency measurement of analog signals, time measurement of digital signals, frequency measurement of digital signals, and noise cancellation.

Embodiment 18

A method of performing a computation at a microcontroller, comprising: performing a main control loop at a central processing unit of a microcontroller; and while performing the first control loop at the central processing unit performing a second control loop, the second control loop comprising: receiving an input signal at an input/output (I/O) connector of the microcontroller; amplifying the input signal responsive to a desired number of bits of resolution; observing a signal level of the amplified signal; adjusting, responsive to the observed signal level, an amplification parameter to keep the amplified signal within a pre-defined dynamic range of the autonomously adjustable ADC; providing a digital signal responsive to the amplified signal; and providing one or more computational results responsive to the digital signal.

Embodiment 19

The method of Embodiment 18, wherein the second control loop further comprises generating the one or more computational results responsive to performing one or more of threshold detection, arithmetic, and comparisons.

Embodiment 20

The method of any of Embodiments 18 and 19, wherein the second control loop further comprises detecting one or more threshold conditions responsive to the one or more computational results.

Embodiment 21

The method of any of Embodiments 18 through 20, wherein the second control loop further comprises sampling the amplified input signal at the desired number of bits of resolution.

Embodiment 22

The method of any of Embodiments 18 through 21, wherein the second control loop may be performed, at least in part, without interrupting the first control loop.

Embodiment 23

The method of any of Embodiments 18 through 22, wherein the first control loop is associated with a lower power mode of the microcontroller and the second control loop is associated with monitoring operation of a system external to the microcontroller.

Embodiment 24

The method of any of Embodiments 18 through 23, wherein the second control loop further comprises interrupting the first control loop responsive to one of the one or more computational results of the second control loop.

Embodiment 25

The method of any of Embodiments 18 through 24, wherein the second control loop further comprises changing a control signal to a monitored system without interrupting the first control loop.

Embodiment 26

A battery monitoring system, comprising: an autonomous monitoring unit, comprising: sampling circuitry configured to: receive an input current indicative of a battery current; sample the input current at a desired number of bits of resolution; and provide one or more battery current samples responsive to the sampling; and processing circuitry configured to generate one or more processing results responsive to the one or more battery current samples; and monitoring logic configured to control one or more battery management systems responsive to the generated one or more processing results.

Embodiment 27

The battery monitoring system of Embodiment 26, wherein the battery comprises one of a single battery and an array of batteries.

Embodiment 28

The battery monitoring system of any of Embodiments 26 and 27, wherein the battery current comprises at least one of an output current of the battery and a charging current of the battery.

Embodiment 29

The battery monitoring system of any of Embodiments 26 through 28, wherein the processing circuitry comprises at least one of detection circuitry and measurement circuitry.

Embodiment 30

The battery monitoring system of any of Embodiments 26 through 29, wherein the processing circuitry further comprises an accumulator configured to receive the battery current samples and generate battery current measurements.

Embodiment 31

The battery monitoring system of any of Embodiments 26 through 30, wherein the detection circuitry is configured to compare the battery current measurements to one or more thresholds and generate detection results responsive to the comparison.

Embodiment 32

The battery monitoring system of any of Embodiments 26 through 31, wherein the detection circuitry is configured to determine an average battery current measurement responsive to the battery current measurements over time intervals and generate the detection results responsive to the determination.

Embodiment 33

The battery monitoring system of any of Embodiments 26 through 32, wherein the processing circuitry is configured to determine an available energy capacity of the battery.

Embodiment 34

The battery monitoring system of any of Embodiments 26 through 33, wherein the processing circuitry is configured to determine an available energy depletion rate of the battery.

Embodiment 35

The battery monitoring system of any of Embodiments 26 through 34, wherein the processing circuitry is configured to determine a time-to-empty of the battery.

Embodiment 36

The battery monitoring system of any of Embodiments 26 through 35, wherein the autonomous monitoring unit is configured to communicate to the monitoring logic by at least one of a peripheral bus, an event system, and interrupts.

Embodiment 37

The battery monitoring system of any of Embodiments 26 through 36, wherein the one or more battery management systems comprise at least one of the event system, a processor, and a pulse-width modulator.

Embodiment 38

The battery monitoring system of any of Embodiments 26 through 37, wherein the event system is configured to generate one or more pulse-width modulator events responsive to the generated one or more processing results.

Embodiment 39

The battery monitoring system of any of Embodiments 26 through 38, wherein the pulse-width modulator is configured to pulse-width-modulate the control signals responsive to signals received from the event system.

Embodiment 40

The battery monitoring system of any of Embodiments 26 through 39, wherein the autonomous monitoring unit is configured to generate one or more interrupts at the pulse-width modulator responsive to the generated one or more processing results.

Embodiment 41

The battery monitoring system of any of Embodiments 26 through 40, wherein the pulse-width modulator is configured to adjust the control signals responsive to the interrupts.

Embodiment 42

The battery monitoring system of any of Embodiments 26 through 41, wherein the pulse-width modulator is configured to adjust the control signals to reduce the amount of current being drawn from the battery.

Embodiment 43

A method for monitoring a battery, comprising: amplifying an input current indicative of a battery current responsive to a desired number of bits of resolution; sampling, at the desired number of bits of resolution, the amplified input current; providing one or more battery current samples; generating one or more processing results responsive to the one or more battery current samples; and controlling one or more battery management systems responsive to the generated one or more processing results.

Embodiment 44

The method of Embodiment 43, wherein sampling the input current comprises sampling at least one of one of a single battery and an array of batteries.

Embodiment 45

The method of any of Embodiments 43 and 44, wherein sampling the input current comprises sampling at least one of an output current of the battery and a charging current of the battery.

Embodiment 46

The method of any of Embodiments 43 through 45, further comprising generating, using an accumulator, battery current measurements.

Embodiment 47

The method of any of Embodiments 43 through 46, further comprising comparing the battery current measurements to one or more thresholds and generating detection results responsive to the comparison.

Embodiment 48

The method of any of Embodiments 43 through 47, further comprising: determining an average current measurement responsive to the battery current measurements over time intervals; and generating the detection results responsive to the determination.

Embodiment 49

The method of any of Embodiments 43 through 48, further comprising determining an available energy capacity of the battery.

Embodiment 50

The method of any of Embodiments 43 through 49, further comprising determining an available energy depletion rate of the battery.

Embodiment 51

The method of any of Embodiments 43 through 50, further comprising determining a battery time-to-empty.

Embodiment 52

The method of any of Embodiments 43 through 51, further comprising generating, using an event system, one or more pulse-width modulator events responsive to the generated one or more processing results.

Embodiment 53

The method of any of Embodiments 43 through 52, further comprising pulse-width modulating, using a pulse-width modulator, control signals responsive to signals received at the event system.

Embodiment 54

The method of any of Embodiments 43 through 53, further comprising generating or more interrupts at the pulse-width modulator responsive to the generated or more processing results.

Embodiment 55

The method of any of Embodiments 43 through 54, further comprising adjusting the control signals responsive to the interrupts.

Embodiment 56

The method of any of Embodiments 43 through 55, further comprising adjusting the control signals to reduce the amount of current being drawn from the battery.

What is claimed is:

1. A microcontroller system, comprising:
a central processing unit;
one or more input/output (I/O) connectors configured to receive an input signal;
an autonomously adjustable analog-to-digital converter (ADC) configured to:
amplify the input signal responsive to a desired number of bits of resolution;
observe a signal level of the amplified input signal;
adjust, responsive to the observed signal level, an amplification parameter to keep the amplified signal within a pre-defined dynamic range of the autonomously adjustable ADC;
sample the amplified input signal at the desired number of bits of resolution;
provide a digital output signal responsive to the amplified signal, and
a computational unit configured to provide one or more computational results responsive to the digital output signal.

2. The microcontroller system of claim 1, wherein the computational unit comprises processing logic circuitry configured to determine the one or more computational results, the processing logic circuitry configured to perform one or more of threshold detection, arithmetic, and comparisons.

3. The microcontroller system of claim 2, wherein the processing logic circuitry is a configurable state machine.

4. The microcontroller system of claim 2, wherein the computational unit comprises one or more of a comparator, a timer, a counter, if-then logic, arithmetic, addition, subtraction, multiplication, division, and averaging.

5. The microcontroller system of claim 1, wherein the autonomously adjustable ADC is operatively coupled to at least one I/O connector of the one or more I/O connectors such that the autonomously adjustable ADC directly receives the input signal from the one or more I/O connectors.

6. The microcontroller system of claim 5, wherein the at least one I/O connector is a general purpose input/output connector.

7. The microcontroller system of claim 1, wherein the autonomously adjustable ADC comprises:
a gain stage circuitry;
an ADC circuitry having at least one input coupled to at least one output of the gain stage circuitry;
a scaler circuitry coupled to at least one output of the ADC circuitry; and
a gain adjustment logic circuitry configured to:
measure a signal level of an ADC input signal;
compare the measured signal level to a gain adjustment threshold, and responsive to the comparison:
configure a gain of the gain stage circuitry; and
configure a scaling component of the scaler circuitry, wherein the scaling component is proportional to the gain of the gain stage circuitry.

8. The microcontroller system of claim 1, further comprising one or more peripheral devices.

9. The microcontroller system of claim 8, further comprising a peripheral bus configured to enable a first peripheral device of the one or more peripheral devices to communicate with a second peripheral device.

10. The microcontroller system of claim 9, wherein the computational unit comprises an interface configured to be coupled to the peripheral bus, and wherein the computational unit is configured to provide the one or more computational results to the interface.

11. The microcontroller system of claim 10, further comprising an event system, wherein the event system is configured to provide one or more events responsive to the one or more computational results.

12. The microcontroller system of claim 11, wherein the event system comprises event logic configured to trigger a detection event of the one or more events responsive to a computational result of the one or more computational results, wherein the computational result is indicative of a threshold detection at the one or more peripheral devices.

13. The microcontroller system of claim 11, wherein the event system comprises event logic configured to trigger a detection event of the one or more events responsive to a computational result of the one or more computational results and a threshold condition.

14. The microcontroller system of claim 11, wherein the event system comprises configurable event system logic.

15. The microcontroller system of claim 11, wherein the central processing unit is configured to perform a main control loop, and a first peripheral device of the one or more peripheral devices and the computational unit are configured to perform a second control loop.

16. The microcontroller system of claim 15, wherein the first peripheral device and the computational unit are configured to perform the second control loop while the central processing unit performs the main control loop and without interrupting the main control loop.

17. The microcontroller system of claim 15, wherein the first peripheral device is configured to perform one of pulse-width modulation, single-shot generation, periodic interrupts, event-driven interrupts, input capture, time measurement of analog signals, frequency measurement of analog signals, time measurement of digital signals, frequency measurement of digital signals, and noise cancellation.

18. A method of performing a computation at a microcontroller, comprising:
performing a first control loop at a central processing unit of a microcontroller; and
while performing the first control loop at the central processing unit performing a second control loop, the second control loop comprising:
receiving an input signal at an input/output (I/O) connector of the microcontroller;
amplifying the input signal responsive to a desired number of bits of resolution;
observing a signal level of the amplified signal;
adjusting, responsive to the observed signal level, an amplification parameter to keep the amplified signal within a pre-defined dynamic range of the autonomously adjustable ADC;
providing a digital signal responsive to the amplified signal; and
providing one or more computational results responsive to the digital signal.

19. The method of claim 18, wherein the second control loop further comprises generating the one or more computational results responsive to performing one or more of threshold detection, arithmetic, and comparisons.

20. The method of claim 18, wherein the second control loop further comprises detecting one or more threshold conditions responsive to the one or more computational results.

21. The method of claim 18, wherein the second control loop further comprises sampling the amplified input signal at the desired number of bits of resolution.

22. The method of claim 18, wherein the second control loop may be performed, at least in part, without interrupting the first control loop.

23. The method of claim 22, wherein the first control loop is associated with a lower power mode of the microcontroller and the second control loop is associated with monitoring operation of a system external to the microcontroller.

24. The method of claim 23, wherein the second control loop further comprises interrupting the first control loop responsive to one of the one or more computational results of the second control loop.

25. The method of claim 23, wherein the second control loop further comprises changing a control signal to a monitored system without interrupting the first control loop.

26. A battery monitoring system, comprising:
an autonomous monitoring unit, comprising:
sampling circuitry configured to:
receive an input current indicative of a battery current;
sample the input current at a desired number of bits of resolution; and
provide one or more battery current samples responsive to the sampling; and
processing circuitry configured to generate one or more processing results responsive to the one or more battery current samples; and
monitoring logic configured to control one or more battery management systems responsive to the generated one or more processing results.

27. The battery monitoring system of claim 26, wherein the battery comprises one of a single battery and an array of batteries.

28. The battery monitoring system of claim 26, wherein the battery current comprises at least one of an output current of the battery and a charging current of the battery.

29. The battery monitoring system of claim 26, wherein the processing circuitry comprises at least one of detection circuitry and measurement circuitry.

30. The battery monitoring system of claim 29, wherein the processing circuitry further comprises an accumulator configured to receive the battery current samples and generate battery current measurements.

31. The battery monitoring system of claim 30, wherein the detection circuitry is configured to compare the battery current measurements to one or more thresholds and generate detection results responsive to the comparison.

32. The battery monitoring system of claim 29, wherein the detection circuitry is configured to determine an average battery current measurement responsive to the battery current measurements over time intervals and generate the detection results responsive to the determination.

33. The battery monitoring system of claim 26, wherein the processing circuitry is configured to determine an available energy capacity of the battery.

34. The battery monitoring system of claim 26, wherein the processing circuitry is configured to determine an available energy depletion rate of the battery.

35. The battery monitoring system of claim 26, wherein the processing circuitry is configured to determine a time-to-empty of the battery.

36. The battery monitoring system of claim 26, wherein the autonomous monitoring unit is configured to communicate to the monitoring logic by at least one of a peripheral bus, an event system, and interrupts.

37. The battery monitoring system of claim 26, wherein the one or more battery management systems comprise at least one of the event system, a processor, and a pulse-width modulator.

38. The battery monitoring system of claim 37, wherein the event system is configured to generate one or more pulse-width modulator events responsive to the generated one or more processing results.

39. The battery monitoring system of claim 38, wherein the pulse-width modulator is configured to pulse-width-modulate the control signals responsive to signals received from the event system.

40. The battery monitoring system of claim 38, wherein the autonomous monitoring unit is configured to generate one or more interrupts at the pulse-width modulator responsive to the generated one or more processing results.

41. The battery monitoring system of claim 38, wherein the pulse-width modulator is configured to adjust the control signals responsive to the interrupts.

42. The battery monitoring system of claim 38, wherein the pulse-width modulator is configured to adjust the control signals to reduce the amount of current being drawn from the battery.

43. A method for monitoring a battery, comprising:
amplifying an input current indicative of a battery current responsive to a desired number of bits of resolution;
sampling, at the desired number of bits of resolution, the amplified input current;
providing one or more battery current samples;
generating one or more processing results responsive to the one or more battery current samples; and
controlling one or more battery management systems responsive to the generated one or more processing results.

44. The method of claim 43, wherein sampling the input current comprises sampling at least one of one of a single battery and an array of batteries.

45. The method of claim 43, wherein sampling the input current comprises sampling at least one of an output current of the battery and a charging current of the battery.

46. The method of claim 43, further comprising generating, using an accumulator, battery current measurements.

47. The method of claim 46, further comprising comparing the battery current measurements to one or more thresholds and generating detection results responsive to the comparison.

48. The method of claim 47, further comprising:
determining an average current measurement responsive to the battery current measurements over time intervals; and
generating the detection results responsive to the determination.

49. The method of claim 48, further comprising determining an available energy capacity of the battery.

50. The method of claim 48, further comprising determining an available energy depletion rate of the battery.

51. The method of claim 48, further comprising determining a battery time-to-empty.

52. The method of claim 43, further comprising generating, using an event system, one or more pulse-width modulator events responsive to the generated one or more processing results.

53. The method of claim 52, further comprising pulse-width modulating, using a pulse-width modulator, control signals responsive to signals received at the event system.

54. The method of claim 52, further comprising generating one or more interrupts at the pulse-width modulator events responsive to the generated or more processing results.

55. The method of claim 52, further comprising adjusting the control signals responsive to the interrupts.

56. The method of claim 54, further comprising adjusting the control signals to reduce the amount of current being drawn from the battery.

\* \* \* \* \*